(12) United States Patent
Wang

(10) Patent No.: US 10,355,034 B2
(45) Date of Patent: Jul. 16, 2019

(54) LOW-TEMPERATURE POLYCRYSTALLINE SILICON ARRAY SUBSTRATE AND MANUFACTURING METHOD, DISPLAY PANEL

(71) Applicant: WUHAN CHINA STAR OPTOELECTRONICS TECHNOLOGY CO., LTD, Wuhan, Hubei (CN)

(72) Inventor: Tao Wang, Hubei (CN)

(73) Assignee: Wuhan China Star Optoelectronics Technology Co., Ltd., Wuhan, Hubei (CN)

( * ) Notice: Subject to any disclaimer, the term of this patent is extended or adjusted under 35 U.S.C. 154(b) by 0 days.

(21) Appl. No.: 15/578,562

(22) PCT Filed: Oct. 13, 2017

(86) PCT No.: PCT/CN2017/105962
§ 371 (c)(1),
(2) Date: Nov. 30, 2017

(87) PCT Pub. No.: WO2019/037210
PCT Pub. Date: Feb. 28, 2019

(65) Prior Publication Data
US 2019/0057986 A1    Feb. 21, 2019

(30) Foreign Application Priority Data
Aug. 21, 2017 (CN) .......................... 201710717966.0

(51) Int. Cl.
*H01L 27/12* (2006.01)
*H01L 21/3213* (2006.01)
(Continued)

(52) U.S. Cl.
CPC ...... *H01L 27/1274* (2013.01); *H01L 21/0262* (2013.01); *H01L 21/02532* (2013.01);
(Continued)

(58) Field of Classification Search
None
See application file for complete search history.

(56) References Cited

U.S. PATENT DOCUMENTS

| | | | |
|---|---|---|---|
| 2003/0155572 A1* | 8/2003 | Han | H01L 27/1281 257/66 |
| 2006/0008953 A1* | 1/2006 | Kuo | H01L 21/268 438/149 |

FOREIGN PATENT DOCUMENTS

| CN | 102097459 A | 6/2011 |
|---|---|---|
| CN | 105957805 A | 9/2016 |

* cited by examiner

*Primary Examiner* — Minh Loan Tran
(74) *Attorney, Agent, or Firm* — Mintz Levin Cohn Ferris Glovsky and Popeo, P.C.; Kongsik Kim; Jhongwoo Jay Peck

(57) ABSTRACT

The present disclosure provides a low-temperature polycrystalline silicon array substrate which includes a substrate, a groove disposed on the substrate, a buffer layer disposed on the substrate, and a polycrystalline silicon active layer disposed on the buffer layer, the groove is located at a channel of a thin film transistor, and the buffer layer covers the groove to form an air layer in the groove. The present disclosure further provides a manufacturing method of a low-temperature polycrystalline silicon array substrate, mainly including: manufacturing a groove at a channel of a thin film transistor on a substrate; depositing a metal sacrificial layer on the substrate, and etching the metal sacrificial layer except the groove through an etching process; sequentially forming a buffer layer and an amorphous silicon layer
(Continued)

on the substrate; and removing the metal sacrificial layer in the groove to form an air layer in the groove.

13 Claims, 3 Drawing Sheets

(51) Int. Cl.
    *H01L 21/02*     (2006.01)
    *H01L 21/285*     (2006.01)
    *H01L 29/66*     (2006.01)
    *H01L 29/786*     (2006.01)

(52) U.S. Cl.
    CPC .. *H01L 21/02592* (2013.01); *H01L 21/02675* (2013.01); *H01L 21/2855* (2013.01); *H01L 21/32133* (2013.01); *H01L 27/1214* (2013.01); *H01L 27/1218* (2013.01); *H01L 27/1222* (2013.01); *H01L 27/1262* (2013.01); *H01L 29/66757* (2013.01); *H01L 29/78672* (2013.01); *H01L 29/78675* (2013.01)

LOW-TEMPERATURE POLYCRYSTALLINE SILICON ARRAY SUBSTRATE AND MANUFACTURING METHOD, DISPLAY PANEL

CROSS-REFERENCES TO RELATED APPLICATIONS

This application is a U.S. national phase application, pursuant to 35 U.S.C. § 371, of PCT/CN2017/105962, filed Oct. 13, 2017, designating the United States, which claims priority to Chinese Application No. 201710717966.0, filed Aug. 21, 2017. The entire contents of the aforementioned patent applications are incorporated herein by this reference.

TECHNICAL FIELD

The present disclosure relates to a technology of a display panel, particularly to a low-temperature polycrystalline silicon array substrate and a manufacturing method, a display panel.

BACKGROUND ART

At present, the display panel as a display component of an electronic apparatus has been widely used in various electronic products, and a backlight module is one important component in a liquid crystal display device. As for a high-end display panel (LCD or OLED), an array substrate usually adopts an LTPS (low-temperature polycrystalline silicon) to form a TFT (thin film transistor). The commonly used manufacturing method of the low-temperature polycrystalline silicon is melting and recrystallizing an amorphous silicon deposited on a substrate through Excimer Laser Anneal (ELA), the polycrystalline silicon formed by a recrystallization manner using ELA has a large amount of grain boundaries, as a surface appearance shown in FIG. 1, the large amount of grain boundaries may be distributed disorderly in the finally formed channel of the TFT, and these grain boundaries may form a defect state center and affect output characteristics of the TFT.

SUMMARY

The present disclosure provides a low-temperature polycrystalline silicon array substrate and a manufacturing method, a display panel in order to overcome defects of the existing technology, in which a polycrystalline silicon active layer is prepared on a flat plane, reduce the number of grain boundaries of the polycrystalline silicon active layer at a channel location of a thin film transistor, improve work stability of a thin film transistor device, and enhance reality effects.

The present disclosure provides a low-temperature polycrystalline silicon array substrate which includes a substrate, a groove disposed on the substrate, a buffer layer disposed on the substrate, and a polycrystalline silicon active layer disposed on the buffer layer, the groove is located at a channel of a thin film transistor, and the buffer layer covers a surface of the groove to form an air layer in the groove.

Further, a depth of the groove is equal to a thickness of the polycrystalline silicon active layer.

The present disclosure further provides a manufacturing method of a low-temperature polycrystalline silicon array substrate, including:

providing a substrate;

manufacturing a groove at a channel of a thin film transistor on the substrate;

disposing a metal sacrificial layer for filling the groove in the groove;

sequentially forming a buffer layer and an amorphous silicon layer on the substrate;

removing the metal sacrificial layer in the groove to form an air layer in the groove; and performing Excimer Laser Anneal on the amorphous silicon layer to make the amorphous silicon layer form a polycrystalline silicon active layer.

Further, the manufacture of the groove at the channel of the thin film transistor on the substrate is specifically manufacturing a groove on the substrate through a photoetching process and an etching process.

Further, the photoetching process adopts one-time photoetching process.

Further, the disposition of the metal sacrificial layer for filling the groove in the groove is specifically depositing a metal sacrificial layer on the substrate, and etching the metal sacrificial layer except the groove through an etching process.

Further, a depth of the groove is equal to a thickness of the polycrystalline silicon active layer.

Further, the removing of the metal sacrificial layer in the groove adopts an etching solution to etch off the metal sacrificial layer in the groove.

The present disclosure further provides a display panel, which includes the low-temperature polycrystalline silicon array substrate.

Compared with the existing technology, in the present disclosure, by disposing a groove at a channel location of the thin film transistor on the substrate, forming an air layer in the groove, when performing laser annealing process on the amorphous silicon layer, since heat dissipation of the channel location of the thin film transistor is worse, while the heat dissipation of source and drain electrode regions of the thin film transistor is better, resulting in that the amorphous silicon layer at the source and drain electrode regions of the thin film transistor will be firstly cured and crystallized to make the molten silicon start to be crystallized from an edge of the source and drain electrodes and grow toward inside the channel, and finally a grain size is increased, and the number of the grain boundaries of the polycrystalline silicon active layer in the channel is reduced, thereby improving the work stability of the thin film transistor device.

DETAILED DESCRIPTION

The present disclosure is explained in further detail below in conjunction with the figures and embodiments.

Figure 1:
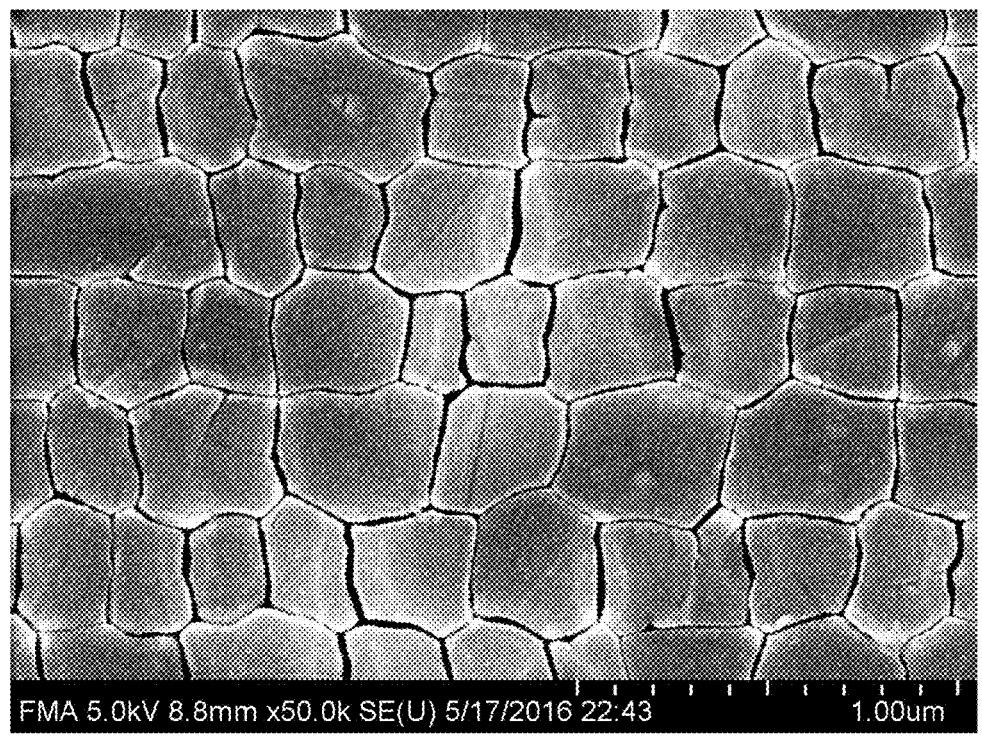
FIG. 1 is a scanning electron microscope image of a polycrystalline silicon active layer formed by a recrystallization using ELA process in the existing technology.
Figure 2:
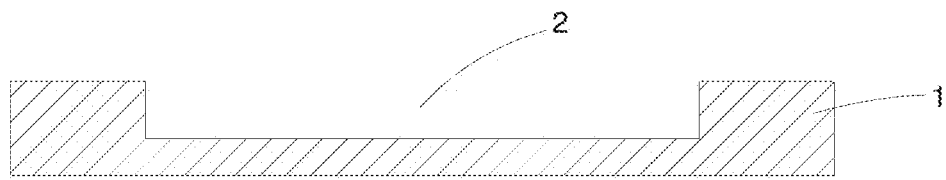
FIG. 2 is a diagram of forming a groove on a substrate.
Figure 3:
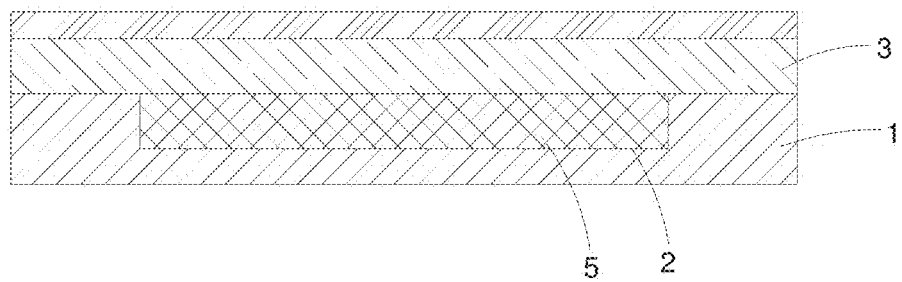
FIG. 3 is a diagram of forming a metal sacrificial layer, a buffer layer and an amorphous silicon layer on a substrate.
Figure 4:
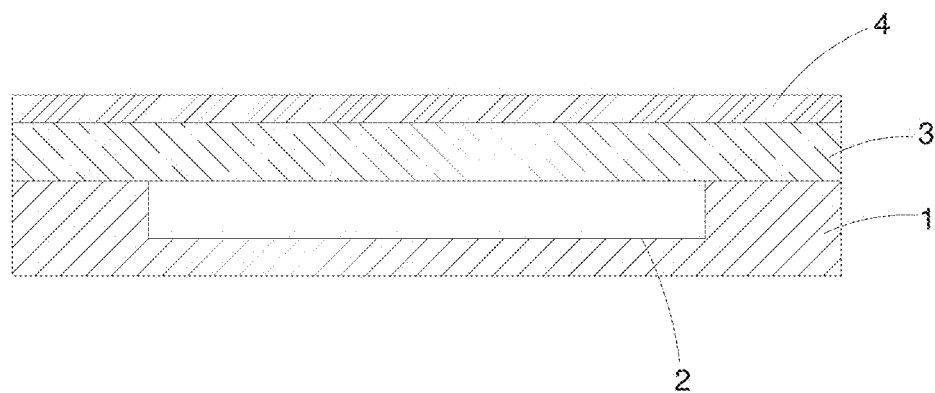
FIG. 4 is diagram of removing a metal sacrificial layer.

As shown in FIG. 4, a low-temperature polycrystalline silicon array substrate in the present disclosure includes a substrate 1, a groove 2 disposed on the substrate 1, a buffer layer 3 disposed on the substrate 1, and a polycrystalline silicon active layer 4 disposed on the buffer layer 3, the groove 2 is located at a channel of a thin film transistor, the buffer layer 3 covers the groove 2 to form an air layer in the groove 2, and the air layer has a function of heat insulation.

Manufacturing of other thin film transistor devices are performed on a polycrystalline silicon active layer 4 after performing Excimer Laser Anneal process, wherein the thin film transistor devices further include a gate insulating layer, a gate electrode, an interlayer insulating layer, a source electrode and a drain electrode and the like formed above the polycrystalline silicon active layer 4; the source electrode and the drain electrode are connected to both ends of the active layer through a via hole of the insulating layer, respectively, since the manufacturing and structure of the thin film transistor device are the same as the manufacturing and structure of the thin film transistor array substrate in the existing technology, they are not described here.

In the present disclosure, a depth of the groove 2 is equal to a thickness of the polycrystalline silicon active layer 4, so as to further ensure the effect of heat insulation.

The manufacturing method of the low-temperature polycrystalline silicon array substrate of the present disclosure includes:

providing a substrate 1;

manufacturing a groove 2 at a channel of a thin film transistor on the substrate 1; in specific, manufacturing the groove 2 corresponding to a channel location of the thin film transistor device on the substrate 1 through one-time photoetching process and an etching process, wherein a depth of the groove 2 is equal to a thickness of the polycrystalline silicon active layer 4, the depth of the groove 2 is equal to the thickness of the polycrystalline silicon active layer 4, and the depth of the groove 2 is adjusted accordingly through the thickness of the polycrystalline silicon active layer 4;

depositing a layer of metal sacrificial layer 5 on the substrate 1, etching the metal sacrificial layer 5 except the groove 2 through an etching process so as to make the metal sacrificial layer 5 be filled in the groove 2; in the present disclosure, the metal sacrificial layer 5 may be, for example, Mg (magnesium), Al (aluminum), Zn (zinc), Mo (molybdenum), Ti (titanium) or an alloy thereof;

sequentially forming a buffer layer 3 and an amorphous silicon layer on the substrate 1, particularly, first depositing the buffer layer 3 and then depositing the amorphous silicon layer; here, depositing the buffer layer 3 may deposit the buffer layer 3 by adopting Plasma Enhanced Chemical Vapor Deposition (PECVD) method in the existing technology; obtaining deposition of the amorphous silicon layer by adopting a chemical vapor deposition method;

removing the metal sacrificial layer 5 in the groove 2 to form an air layer in the groove 2; and in specific, etching off the metal sacrificial layer 5 in the groove 2 by adopting an etching solution to form a heat insulating air layer in the groove, so that heat conduction effect in this region is lower than the remaining regions; accordingly, the etching solution may be selected as any one or more of hydrochloric acid, dilute sulfuric acid and phosphoric acid. The etching solution is easy to react chemically with the metal sacrificial layer 5, and all of other material layers are not dissolved or difficult to be dissolved in the etching solution. Of course, those skilled in the art may know that, according to this principle, the material of the metal sacrificial layer 5 and the material of the etching solution can also be changed;

the performing Excimer Laser Anneal (ELA) on the amorphous silicon layer to make the amorphous silicon layer form a polycrystalline silicon active layer 4, specifically is performing Excimer Laser Anneal on the amorphous silicon layer, wherein laser beam is located above the substrate 1, so as to obtain a polycrystalline silicon thin film. An excimer laser adopted by the Excimer Laser Anneal is any one of xenon chloride excimer laser, krypton fluoride excimer laser and argon fluoride excimer laser.

Figure 5:
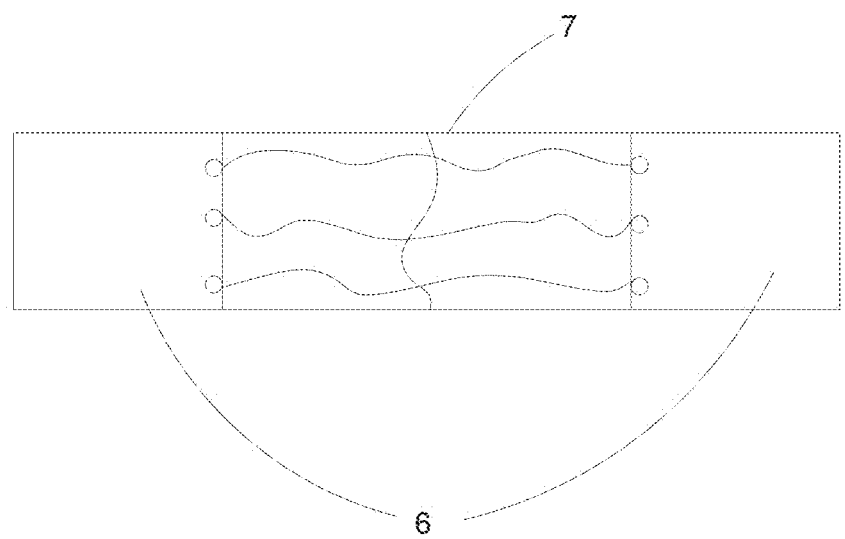
FIG. 5 is a crystallization state diagram of a polycrystalline silicon active layer in a channel after performing ELA process on an amorphous silicon layer.

During manufacturing the low-temperature polycrystalline silicon array substrate, an air layer is disposed below a location corresponding to a channel of the thin film transistor device, in this way, when performing the Excimer Laser Anneal process, since there is the air layer in the channel location, and the air layer insulates the heat to be transmitted and dissipated through the substrate, the heat dissipation is worse, while the heat dissipation of source and drain electrode regions 6 of the thin film transistor device corresponding to both sides of a channel 7 is better (as shown in FIG. 5), which will be firstly cured and crystallized, so that the molten silicon starts to crystallize from an edge of the amorphous silicon of the source and drain electrode region and grows toward inside the channel, finally a crystallization effect having a fixed grain boundary direction as shown in FIG. 5 is formed, meanwhile, since the channel region has a good heat preservation effect, finally a grain size is large, and the number of grain boundaries of the polycrystalline silicon in the channel can be greatly reduced; in addition, since the air layer is formed in the groove, the molten silicon is on a flat horizontal buffer layer when performing the Excimer Laser Anneal, compared with the existing process of performing the Excimer Laser Anneal on the buffer layer having a graph protrusion, finally the crystallization effect of the polycrystalline silicon can also be improved greatly, and problems of a lower migration rate in a low-temperature polycrystalline silicon display backboard, a larger leakage current of the thin film transistor and non-uniformities of the migration rate and threshold voltage can be solved.

After the manufacturing of the above polycrystalline silicon active layer 4 is completed, other thin film transistor devices can be prepared by: forming a gate insulating layer, a gate electrode, an interlayer insulating layer, and source and drain electrodes above the active layer, specifically as follows:

depositing the gate insulating layer above the polycrystalline silicon active layer 4;

performing a doping process on regions of both ends of the active layer by using a mask process, so as to form ohmic contact regions at both ends of the polycrystalline silicon active layer 4;

forming a gate metal thin film through a physical vapor deposition (PVD) above the gate insulating layer, and patterning to form a gate electrode;

depositing the interlayer insulating layer above the gate electrode, and manufacturing insulating layer via holes that penetrates through the gate insulating layer and the interlayer insulating layer, so as to expose the ohmic contact regions at both ends of the polycrystalline silicon active layer 4; and forming a source and drain metal thin film above the interlayer insulating layer, and patterning to form a source electrode and a drain electrode, wherein the source electrode and the drain electrode are connected to the ohmic contact regions at both ends of the polycrystalline silicon active layer 4 through the insulating layer via holes, respectively.

It is worthy of noting that the above contents are merely exemplary narrations for the other devices than the polycrystalline silicon active layer 4 of the thin film transistor device, but the manufacturing of the thin film transistor device is not limited hereto.

The present disclosure can be applied in a liquid crystal display panel or an organic light emitting diode display panel, by disposing a groove, so that a grain size of the amorphous silicon after the crystallization through the Excimer Laser Anneal corresponding to the channel of the thin film transistor is increased (as shown in FIG. 5), and a defect state of the grain boundary is reduced, and the grain boundary direction can be controlled to be parallel to a channel direction, thereby effectively improving yield of the thin film transistor device and effectively improving output ability.

A display panel of the present disclosure is obtained through the above low-temperature polycrystalline silicon array substrate and manufacturing method, which are not described here.

Although the present disclosure has been illustrated and described with reference to the particular embodiment, those skilled in the art will understand: various changes in form and details may be made therein without departing from the spirit and scope of the disclosure as defined by the appended claims and its equivalents.

The invention claimed is:

1. A low-temperature polycrystalline silicon array substrate, comprising:
   a substrate;
   a groove concavely formed on an upper surface of the substrate;
   a buffer layer disposed on the substrate; and
   a polycrystalline silicon active layer disposed on the buffer layer,
   wherein the groove is located at a channel of a thin film transistor, and the buffer layer covers a surface of the groove to form an air layer in the groove.

2. The low-temperature polycrystalline silicon array substrate of claim 1, wherein a depth of the groove is equal to a thickness of the polycrystalline silicon active layer.

3. A manufacturing method of a low-temperature polycrystalline silicon array substrate, comprising:
   providing a substrate;
   manufacturing a groove at a channel of a thin film transistor on a substrate;
   disposing a metal sacrificial layer for filling the groove in the groove;
   sequentially forming a buffer layer and an amorphous silicon layer on the substrate;
   removing the metal sacrificial layer in the groove to form an air layer in the groove; and
   performing Excimer Laser Anneal on the amorphous silicon layer to make the amorphous silicon layer form a polycrystalline silicon active layer.

4. The manufacturing method of the low-temperature polycrystalline silicon array substrate of claim 3, wherein the manufacturing of the groove at the channel of the thin film transistor on the substrate is specifically manufacturing of a groove on the substrate through a photoetching process and an etching process.

5. The manufacturing method of the low-temperature polycrystalline silicon array substrate of claim 4, wherein the photoetching process adopts one-time photoetching process.

6. The manufacturing method of the low-temperature polycrystalline silicon array substrate of claim 5, wherein a depth of the groove is equal to a thickness of the polycrystalline silicon active layer.

7. The manufacturing method of the low-temperature polycrystalline silicon array substrate of claim 4, wherein a depth of the groove is equal to a thickness of the polycrystalline silicon active layer.

8. The manufacturing method of the low-temperature polycrystalline silicon array substrate of claim 3, wherein the disposing of the metal sacrificial layer for filling the groove in the groove is specifically depositing of a metal sacrificial layer on the substrate, and etching of the metal sacrificial layer except the groove through an etching process.

9. The manufacturing method of the low-temperature polycrystalline silicon array substrate of claim 8, wherein a depth of the groove is equal to a thickness of the polycrystalline silicon active layer.

10. The manufacturing method of the low-temperature polycrystalline silicon array substrate of claim 8, wherein the removing of the metal sacrificial layer in the groove adopts an etching solution to etch off the metal sacrificial layer in the groove.

11. The manufacturing method of the low-temperature polycrystalline silicon array substrate of claim 3, wherein a depth of the groove is equal to a thickness of the polycrystalline silicon active layer.

12. A display panel, comprising a low-temperature polycrystalline silicon array substrate, which comprises:
   a substrate;
   a groove concavely formed on an upper surface of the substrate;
   a buffer layer disposed on the substrate; and
   a polycrystalline silicon active layer disposed on the buffer layer,
   wherein the groove is located at a channel of a thin film transistor, and the buffer layer covers a surface of the groove to form an air layer in the groove.

13. The display panel of claim 12, wherein a depth of the groove is equal to a thickness of the polycrystalline silicon active layer.

* * * * *